: US 8,453,036 B1
(45) Date of Patent: May 28, 2013

(12) United States Patent
Goel et al.

(54) SYSTEM AND METHOD FOR DYNAMICALLY RESIZING A PARITY DECLUSTERED GROUP

(75) Inventors: Atul Goel, San Jose, CA (US); Yan Li, Sunnyvale, CA (US)

(73) Assignee: Network Appliance, Inc., Sunnyvale, CA (US)

( * ) Notice: Subject to any disclaimer, the term of this patent is extended or adjusted under 35 U.S.C. 154(b) by 624 days.

(21) Appl. No.: 12/697,988

(22) Filed: Feb. 1, 2010

(51) Int. Cl.
*H03M 13/00* (2006.01)

(52) U.S. Cl.
USPC ........................................................ 714/763

(58) Field of Classification Search
USPC .............. 714/4.11, 4.12, 4.2, 4.3, 6.11, 6.12, 714/6.22, 6.3, 6.31, 6.32, 702, 763
See application file for complete search history.

(56) References Cited

U.S. PATENT DOCUMENTS

| | | | |
|---|---|---|---|
| 6,079,028 A * | 6/2000 | Ozden et al. | 714/6.23 |
| 6,671,773 B2 | 12/2003 | Kazar et al. | |
| 7,120,826 B2 * | 10/2006 | Fore et al. | 714/6.2 |
| 7,921,262 B1 * | 4/2011 | Dash et al. | 711/154 |
| 8,001,352 B1 * | 8/2011 | Chatterjee et al. | 711/165 |
| 8,099,623 B1 * | 1/2012 | Li et al. | 714/6.22 |
| 2003/0149750 A1 * | 8/2003 | Franzenburg | 709/220 |
| 2004/0250161 A1 * | 12/2004 | Patterson | 714/6 |
| 2012/0030425 A1 * | 2/2012 | Becker-Szendy et al. | 711/114 |

\* cited by examiner

*Primary Examiner* — Nadeem Iqbal
(74) *Attorney, Agent, or Firm* — Blakely, Sokoloff, Taylor & Zafman LLP

(57) ABSTRACT

A storage server resizes an array of mass storage devices and distributes data blocks stored in the array of mass storage devices evenly in a declustered organization across the resized array of mass storage devices. Resizing the array of mass storage devices may include adding a new mass storage device to the array or removing a mass storage device from the array. During resizing a data block is moved from one mass storage device to another mass storage device to minimize the imbalance of parity groups shared by the new mass storage devices in the array, as well as minimize the number of data blocks to be moved to uniformly balance the load across the new mass storage device.

14 Claims, 11 Drawing Sheets

400

| | D0 | D1 | D2 | D3 | D4 | D5 |
|---|---|---|---|---|---|---|
| | $D_1$ | $D_1$ | $D_1$ | $D_1$ | $D_1$ | $P_1$ |
| | $D_2$ | $D_2$ | $D_2$ | $D_2$ | $D_2$ | $P_2$ |
| | $D_3$ | $D_3$ | $D_3$ | $D_3$ | $D_3$ | $P_3$ |
| | $D_4$ | $D_4$ | $D_4$ | $D_4$ | $D_4$ | $P_4$ |

| | D0 | D1 | D2 | D3 | D4 | D5 |
|---|---|---|---|---|---|---|
| | $D_1$ | $D_1$ | $D_1$ | $D_1$ | $P_1$ | $D_2$ |
| | $D_2$ | $D_2$ | $D_2$ | $P_2$ | $D_3$ | $D_3$ |
| | $D_3$ | $D_3$ | $P_3$ | $D_4$ | $D_4$ | $D_4$ |
| | $D_4$ | $P_4$ | $D_5$ | $D_5$ | $D_5$ | $P_5$ |

Fig. 4b

| | D0 | D1 | D2 | D3 | D4 | D5 | D6 | D7 |
|---|---|---|---|---|---|---|---|---|
| | P1 | P1 | P1 | P1 | P2 | P2 | P2 | P2 |
| | P3 | P3 | P4 | P4 | P3 | P3 | P4 | P4 |
| | P5 | P6 | P5 | P6 | P5 | P6 | P5 | P6 |
| | P7 | P7 | P8 | P8 | P8 | P8 | P7 | P7 |
| | P9 | P10 | P10 | P9 | P9 | P10 | P10 | P9 |
| | P11 | P12 | P11 | P12 | P12 | P11 | P12 | P11 |
| | P13 | P14 | P14 | P13 | P14 | P13 | P13 | P14 |
| | P15 | P15 | P15 | P15 | P16 | P16 | P16 | P16 |
| | P17 | P17 | P18 | P18 | P17 | P17 | P18 | P18 |
| | P19 | P20 | P19 | P20 | P19 | P20 | P19 | P20 |

500

550

| | D0 | D1 | D2 | D3 | D4 | D5 | D6 | D7 |
|---|---|---|---|---|---|---|---|---|
| D0 | 0 | 5 | 5 | 4 | 5 | 4 | 4 | 3 |
| D1 | 5 | 0 | 4 | 5 | 4 | 5 | 3 | 4 |
| D2 | 5 | 4 | 0 | 5 | 4 | 3 | 5 | 4 |
| D3 | 4 | 5 | 5 | 0 | 3 | 4 | 4 | 5 |
| D4 | 5 | 4 | 4 | 3 | 0 | 5 | 5 | 4 |
| D5 | 4 | 5 | 3 | 4 | 5 | 0 | 4 | 5 |
| D6 | 4 | 3 | 5 | 4 | 5 | 4 | 0 | 5 |
| D7 | 3 | 4 | 4 | 5 | 4 | 5 | 5 | 0 |

|  | D0 | D1 | D2 | D3 | D4 | D5 | D6 | D7 | D8 |
|---|----|----|----|----|----|----|----|----|----|
|  | P1 | P1 | P1 | P1 | P2 | P2 | P2 | P2 | 19 |
|  | P3 | P3 | P4 | P4 | P3 | P3 | P4 | P4 | 20 |
|  | P5 | P6 | P5 | P6 | P5 | P6 | P5 | P6 |    |
|  | P7 | P7 | P8 | P8 | P8 | P8 | P7 | P7 |    |
|  | P9 | P10| P10| P9 | P9 | P10| P10| P9 |    |
|  | P11| P12| P11| P12| P12| P11| P12| P11|    |
|  | P13| P14| P14| P13| P14| P13| P13| P14|    |
|  | P15| P15| P15| P15| P16| P16| P16| P16|    |
|  | P17| P17| P18| P18| P17| P17| P18| P18|    |
|  |    |    | P19| P20| P19| P20| P19| P20|    |

600

650

|    | D0 | D1 | D2 | D3 | D4 | D5 | D6 | D7 | D8 |
|----|----|----|----|----|----|----|----|----|----|
| D0 | 0  | 5  | 4  | 4  | 4  | 4  | 3  | 3  | 0  |
| D1 | 5  | 0  | 4  | 4  | 4  | 4  | 3  | 3  | 0  |
| D2 | 4  | 4  | 0  | 5  | 4  | 3  | 5  | 4  | 1  |
| D3 | 4  | 4  | 5  | 0  | 3  | 4  | 4  | 5  | 1  |
| D4 | 4  | 4  | 4  | 3  | 0  | 5  | 5  | 4  | 1  |
| D5 | 4  | 4  | 3  | 4  | 5  | 0  | 4  | 5  | 1  |
| D6 | 3  | 3  | 5  | 4  | 5  | 4  | 0  | 5  | 1  |
| D7 | 3  | 3  | 4  | 5  | 4  | 5  | 5  | 0  | 1  |
| D8 | 0  | 0  | 1  | 1  | 1  | 1  | 1  | 1  | 0  |

| D0 | D1 | D2 | D3 | D4 | D5 | D6 | D7 | D8 |
|---|---|---|---|---|---|---|---|---|
| P1 | P1 |  | P1 | P2 | P2 | P2 | P2 | P19 |
| P3 | P3 | P4 | P4 | P3 | P3 | P4 | P4 | P20 |
| P5 | P6 | P5 | P6 | P5 | P6 | P5 | P6 | P1 |
| P7 | P7 | P8 | P8 | P8 | P8 | P7 | P7 |  |
| P9 | P10 | P10 | P9 | P9 | P10 | P10 | P9 |  |
| P11 | P12 | P11 | P12 | P12 | P11 | P12 | P11 |  |
| P13 | P14 | P14 | P13 | P14 | P13 | P13 | P14 |  |
| P15 | P15 | P15 | P15 | P16 | P16 | P16 | P16 |  |
| P17 | P17 | P18 | P18 | P17 | P17 | P18 | P18 |  |
|  |  | P19 | P20 | P19 | P20 | P19 | P20 |  |

|  | D0 | D1 | D2 | D3 | D4 | D5 | D6 | D7 | D8 |
|---|---|---|---|---|---|---|---|---|---|
| D0 | 0 | 5 | 3 | 4 | 4 | 4 | 3 | 3 | 1 |
| D1 | 5 | 0 | 3 | 4 | 4 | 4 | 3 | 3 | 1 |
| D2 | 3 | 3 | 0 | 4 | 4 | 3 | 5 | 4 | 1 |
| D3 | 4 | 4 | 4 | 0 | 3 | 4 | 4 | 5 | 2 |
| D4 | 4 | 4 | 4 | 3 | 0 | 5 | 5 | 4 | 1 |
| D5 | 4 | 4 | 3 | 4 | 5 | 0 | 4 | 5 | 1 |
| D6 | 3 | 3 | 5 | 4 | 5 | 4 | 0 | 5 | 1 |
| D7 | 3 | 3 | 4 | 5 | 4 | 5 | 5 | 0 | 1 |
| D8 | 1 | 1 | 1 | 2 | 1 | 1 | 1 | 1 | 0 |

|     | D0  | D1  | D2  | D3  | D4  | D5  | D6  | D7  | D8  |
|-----|-----|-----|-----|-----|-----|-----|-----|-----|-----|
|     | P1  | P1  | P1  | P1  | P2  | P2  | P2  | P2  | P2  |
|     | P3  | P3  | P4  | P4  | P3  | P3  | P4  | P4  | P3  |
|     | P5  | P6  | P5  | P6  | P5  | P6  | P5  | P6  | P5  |
|     | P7  | P7  | P8  | P8  | P8  | P8  | P7  | P7  |     |
|     | P9  | P10 | P10 | P9  | P9  | P10 | P10 | P9  |     |
|     | P11 | P12 | P11 | P12 | P12 | P11 | P12 | P11 |     |
|     | P13 | P14 | P14 | P13 | P14 | P13 | P13 | P14 |     |
|     | P15 | P15 | P15 | P15 | P16 | P16 | P16 | P16 |     |
|     | P17 | P17 | P18 | P18 | P17 | P17 | P18 | P18 |     |
|     | P19 | P20 | P19 | P20 | P19 | P20 | P19 | P20 |     |

|     | D0 | D1 | D2 | D3 | D4 | D5 | D6 | D7 | D8 |
|-----|----|----|----|----|----|----|----|----|----|
| D0  | 0  | 5  | 5  | 4  | 5  | 4  | 4  | 3  | 2  |
| D1  | 5  | 0  | 4  | 5  | 4  | 5  | 3  | 4  | 1  |
| D2  | 5  | 4  | 0  | 5  | 4  | 3  | 5  | 3  | 1  |
| D3  | 4  | 5  | 5  | 0  | 3  | 4  | 4  | 5  | 0  |
| D4  | 5  | 4  | 4  | 3  | 0  | 5  | 5  | 4  | 3  |
| D5  | 4  | 5  | 3  | 4  | 5  | 0  | 4  | 5  | 2  |
| D6  | 4  | 3  | 5  | 4  | 5  | 4  | 0  | 5  | 2  |
| D7  | 3  | 4  | 3  | 5  | 4  | 5  | 5  | 0  | 1  |
| D8  | 2  | 1  | 1  | 0  | 3  | 2  | 2  | 1  | 0  |

| | D0 | D1 | D2 | D3 | D4 | D5 | D6 | D7 | D8 |
|---|---|---|---|---|---|---|---|---|---|
| | P1 | P1 | P1 | P1 | P2 | P2 | P2 | P2 | |
| | P3 | P3 | P4 | P4 | P3 | P3 | P4 | P4 | P3 |
| | P5 | P6 | P5 | P6 | P5 | P6 | P5 | P6 | P5 |
| | P7 | P7 | P8 | P8 | P8 | P8 | P7 | P7 | |
| | P9 | P10 | P10 | P9 | P9 | P10 | P10 | P9 | |
| | P11 | P12 | P11 | P12 | P12 | P11 | P12 | P11 | |
| | P13 | P14 | P14 | P13 | P14 | P13 | P13 | P14 | |
| | P15 | P15 | P15 | P15 | P16 | P16 | P16 | P16 | |
| | P17 | P17 | P18 | P18 | P17 | P17 | P18 | P18 | |
| | P19 | P20 | P19 | P20 | P19 | P20 | P19 | P20 | |
| | | | P2 | | | | | | |

1100 ⟶     Fig. 11a     ⟵ 1150

| | D0 | D1 | D2 | D3 | D4 | D5 | D6 | D7 | D8 |
|---|---|---|---|---|---|---|---|---|---|
| D0 | 0 | 5 | 5 | 4 | 5 | 4 | 4 | 3 | 2 |
| D1 | 5 | 0 | 4 | 5 | 5 | 6 | 4 | 5 | 1 |
| D2 | 5 | 4 | 0 | 5 | 5 | 4 | 6 | 4 | 1 |
| D3 | 4 | 5 | 5 | 0 | 3 | 4 | 4 | 5 | 0 |
| D4 | 5 | 5 | 5 | 3 | 0 | 5 | 5 | 4 | 2 |
| D5 | 4 | 6 | 4 | 4 | 5 | 0 | 4 | 5 | 1 |
| D6 | 4 | 4 | 6 | 4 | 5 | 4 | 0 | 5 | 1 |
| D7 | 3 | 5 | 4 | 5 | 4 | 5 | 5 | 0 | 0 |
| D8 | 2 | 1 | 1 | 0 | 2 | 1 | 1 | 0 | 0 |

Fig. 11b

SYSTEM AND METHOD FOR DYNAMICALLY RESIZING A PARITY DECLUSTERED GROUP

TECHNICAL FIELD

This invention relates to the field of data storage systems and, in particular, to dynamically resizing a parity declustered group.

BACKGROUND

Various forms of network storage systems are known today. These forms include network attached storage (NAS), storage area networks (SANs), and others. Network storage systems are commonly used for a variety of purposes, such as providing multiple users with access to shared data, backing up critical data (e.g., by data mirroring), etc.

A network storage system can include at least one storage system, which is a processing system configured to store and retrieve data on behalf of one or more storage client processing systems ("clients"). In the context of NAS, a storage system may be a file server, which is sometimes called a "filer". A filer operates on behalf of one or more clients to store and manage shared files in a set of mass storage devices, such as magnetic or optical disks or tapes, or flash drives. The mass storage devices may be organized into one or more volumes of a Redundant Array of Inexpensive Disks (RAID). In a SAN context, the storage server provides clients with block-level access to stored data, rather than file-level access. Some storage servers are capable of providing clients with both file-level access and block-level access.

A RAID group may include an array of mass storage devices with data from a filesystem stored across the mass storage devices in stripes. During configuration, storage spaces on each of the storage devices are divided into data units formed by a contiguous set of data blocks. A RAID group is then created by selecting blocks across the set of storage devices, and grouping the selected blocks as a "parity group". An array of storage devices can be configured with multiple parity groups. The array can then be presented as a single storage drive to external systems, and each of the parity groups can be seen as a contiguous storage unit. Since extra disks can be used to offload some of the I/O traffic from disks participating in the reconstruction of a parity group, the read and write bandwidth bottlenecks commonly associated with traditional RAID implementations may be reduced.

Parity declustering may also be implemented in the array to further improve performance and recovery times. With parity declustering, parity groups are distributed across disks to produce a balanced I/O load on surviving disks. However, several challenges exist with conventional techniques for balancing I/O load across disks during reconstruction. In particular, conventional techniques for generating a declustered layout use a static approach which enforces a restriction of the same stripe width (i.e., the number of mass storage devices in the RAID group) and RAID scheme on parity groups in the array to ensure a balanced distribution. Declustering parity groups with different RAID schemes or different stripe widths to facilitate particular storage requirements is not viable.

As the amount of storage needed by the filesystem increases or decreases, it may become necessary to add or remove a mass storage device from the RAID group. Such modifications may also include adding a disk to the array, logically partitioning disk space into various sized "containers" constituting parity groups, resizing containers, manually rebalancing storage resources to service more frequently accessed data ("hot data"), etc. In a traditional RAID group based organization, addition of mass storage devices to a RAID group causes the stripe-width to increase. Once the stripe-width reaches a predetermined maximum size, the addition of a new mass storage device causes the creation of a new RAID group. If the filesystem was already fairly full, then subsequent data allocation is confined to the newly added mass storage devices. If the newly added mass storage devices are few in number, then it would result in sub-optimal read performance, as the uniform characteristics of the parity groups are affected thereby changing the distribution of I/O traffic, including reconstruction load, offloaded to the surviving disks.

SUMMARY OF THE INVENTION

A storage server resizes an array of mass storage devices and distributes data blocks stored in the array of mass storage devices evenly in a declustered organization across the resized array of mass storage devices. Resizing the array of mass storage devices may include adding a new mass storage device to the array or removing a mass storage device from the array. During resizing a data block is moved from one mass storage device to another mass storage device to minimize the imbalance of parity groups shared by the new mass storage devices in the array, as well as minimize the number of data blocks to be moved to uniformly balance the load across the new mass storage device.

BRIEF DESCRIPTION OF THE DRAWINGS

The present invention is illustrated by way of example, and not by way of limitation, in the figures of the accompanying drawings.

FIG. 4a is a block diagram illustrating a disk array according to an embodiment.

FIG. 4b is a block diagram illustrating a declustered disk array according to an embodiment.

FIG. 8a is a block diagram illustrating a declustered disk array according to an embodiment.

FIG. 8b is a block diagram illustrating a matrix of shared parity groups for a declustered disk array according to an embodiment.

FIG. 9a is a block diagram illustrating the removal of a disk from a declustered disk array according to an embodiment.

FIG. 9b is a block diagram illustrating a matrix of shared parity groups for a declustered disk array according to an embodiment.

FIG. 11a is a block diagram illustrating a declustered disk array according to an embodiment.

FIG. 11b is a block diagram illustrating a matrix of shared parity groups for a declustered disk array according to an embodiment.

DETAILED DESCRIPTION

In the following detailed description of embodiments of the invention, reference is made to the accompanying drawings in which like references indicate similar elements, and in which is shown by way of illustration specific embodiments in which the invention may be practiced. These embodiments are described in sufficient detail to enable those skilled in the art to practice the invention, and it is to be understood that other embodiments may be utilized and that logical, mechanical, electrical, functional and other changes may be made without departing from the scope of the present invention. The following detailed description is, therefore, not to be taken in a limiting sense, and the scope of the present invention is defined only by the appended claims.

Embodiments are described to resize an array of mass storage devices and distribute data blocks stored in the array of mass storage devices evenly in a declustered organization across the resized array of mass storage devices. Resizing the array of mass storage devices may include adding a new mass storage device to the array or removing a mass storage device from the array. During resizing a data block is moved from one mass storage device to another mass storage device to minimize the imbalance of parity groups shared by the new mass storage devices in the array.

Figure 1:
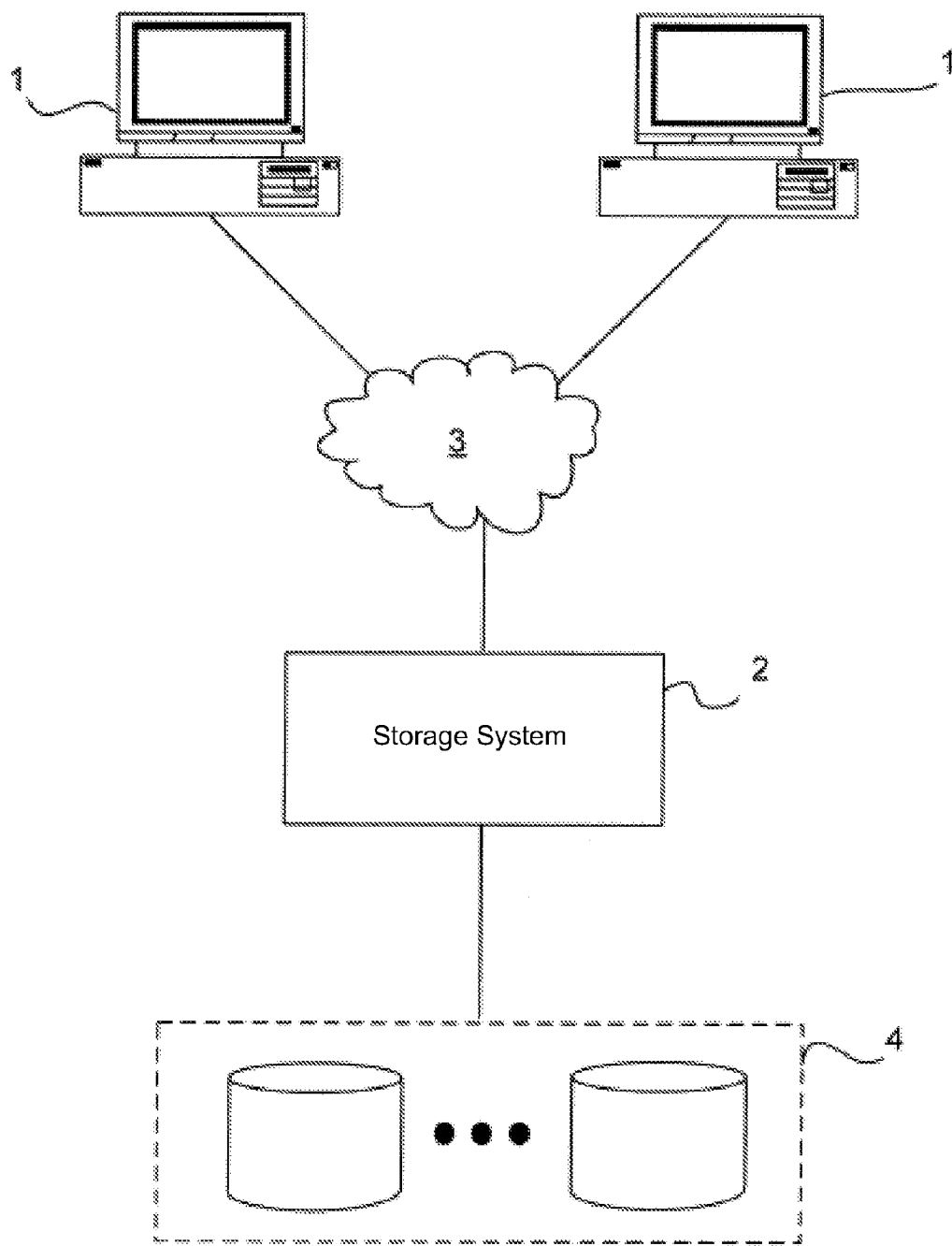
FIG. 1 is a block diagram illustrating a network environment including a storage system according to an embodiment.

FIG. 1 shows an example of a network environment which incorporates a storage system 2, which can be a file server. Note, however, that the invention is not limited to use in traditional file servers. For example, the invention can be adapted for use in other types of storage systems, such as storage servers which provide clients with block-level access to stored data or processing systems other than storage servers.

The storage system 2 in FIG. 1 is coupled locally to a storage subsystem 4 which includes a set of mass storage devices, and to a set of storage clients 1 (hereinafter "clients") through a network 3, which may be a local area network (LAN), a wide area network (WAN), a global area network (GAN) such as the Internet, or a combination of such networks. Each of the clients 1 may be, for example, a conventional personal computer (PC), workstation, or the like. The storage subsystem 4 is managed by the storage system 2. The storage system 2 receives and responds to various read and write requests from the clients 1, directed to data stored in or to be stored in the storage subsystem 4. The mass storage devices in the storage subsystem 4 may be, for example, conventional magnetic disks, optical disks such as CD-ROM or DVD based storage, magneto-optical (MO) storage, or any other type of non-volatile storage devices suitable for storing large quantities of data. In one embodiment, the mass storage devices in storage subsystem 4 are flash-based solid-state devices (SSDs), sometimes known as flash drives.

The storage system 2 may have a distributed architecture; for example, it may include a separate N-("network") blade and D-("disk") blade (not shown). In such an embodiment, the N-blade is used to communicate with clients 1, while the D-blade includes the file system functionality and is used to communicate with the storage subsystem 4. In one embodiment, the N-blade and D-blade communicate with each other using an internal protocol. In one embodiment, where the N-blade or D-blade has its own separate processor and memory, separate from that of the storage server, the storage device slicing method, as further described below, is implemented within the N-blade or D-blade. Alternatively, the storage system 2 may have an integrated architecture, where the network and data components are all contained in a single box. The storage system 2 further may be coupled through a switching fabric to other similar storage systems (not shown) which have their own local storage subsystems. In this way, all of the storage subsystems can form a single storage pool, to which any client of any of the storage systems has access.

Figure 2:
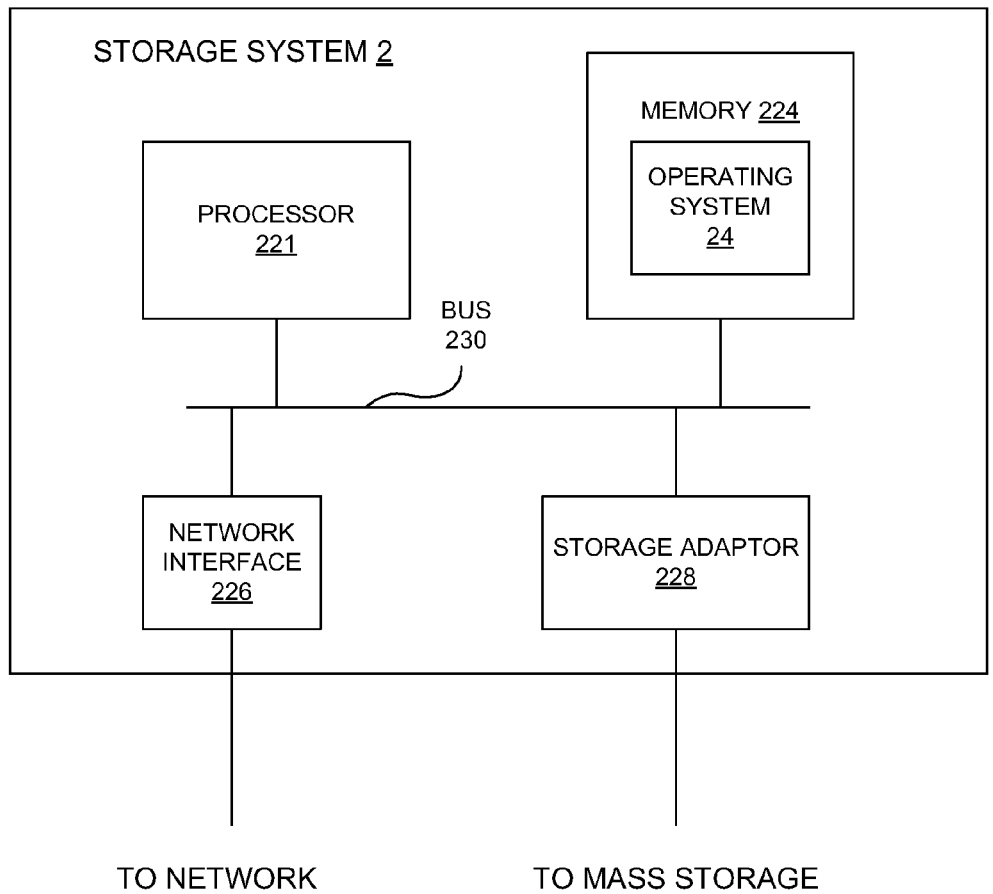
FIG. 2 is a block diagram illustrating a hardware architecture of a storage system according to an embodiment.

FIG. 2 illustrates a schematic block diagram of one embodiment of a storage system 2 which may implement the above-described schemes, according to certain embodiments of the invention. Referring to FIG. 2, in this embodiment, the storage system 2 includes a processor 221, a memory 224, a network interface 226, and a storage adaptor 228, which are coupled to each other via a bus system 230. The bus system 230 may include one or more busses and/or interconnects. The storage system 2 communicates with a network via the network interface 226, which may be an Ethernet adaptor, fiber channel adaptor, etc. The network interface 226 may be coupled to a public network, a private network, or a combination of both in order to communicate with a client machine usable by an administrator of the remote data storage system.

In one embodiment, the processor 221 reads instructions from the memory 224 and executes the instructions. The memory 224 may include any of various types of memory devices, such as, for example, random access memory (RAM), read-only memory (ROM), flash memory, one or more mass storage devices (e.g., disks), etc. The memory 224 stores instructions of an operating system 24. The processor 221 retrieves the instructions from the memory 224 to run the operating system 24. The storage system 2 interfaces with one or more storage systems via the storage adaptor 228, which may include a small computer system interface (SCSI) adaptor, fiber channel adaptor, etc.

Figure 3:
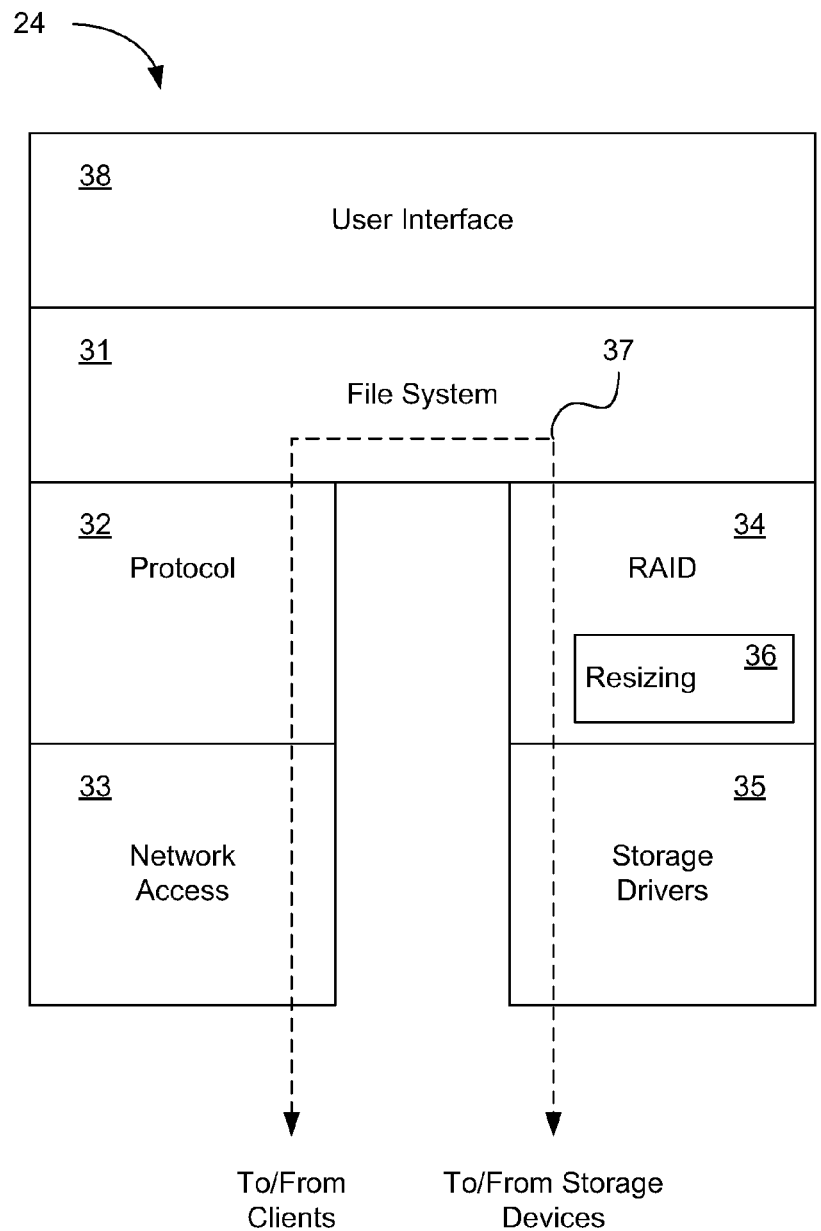
FIG. 3 is a block diagram illustrating the architecture of the operating system of the storage system according to an embodiment.

FIG. 3 shows an example of the operating system 24 of the storage system 2. As shown, the operating system 24 includes several modules, or "layers." These layers include a file system 31. The file system 31 is software, executed by a processor, that imposes a hierarchy (e.g., a directory/file structure) on the data stored in the storage subsystem 4 and manages read/write operations on the data (i.e., executes read/write operations on the disks in response to client requests). The operating system 24 also includes a protocol layer 32 and an associated network access layer 33, to allow the storage system 2 to communicate over the network 3 (e.g., with clients 1). The protocol 32 layer implements a number of higher-level network protocols, such as Network File System (NFS), Common Internet File System (CIFS), Hypertext Transfer Protocol (HTTP) and/or Transmission Control Protocol/Internet Protocol (TCP/IP). The network access layer 33 includes one or more drivers which implement one or more lower-level protocols to communicate over the network, such as Ethernet or Fibre Channel.

The operating system 24 also includes a storage access layer 34 and an associated storage driver layer 35, to allow the storage system 2 to communicate with the storage subsystem 4. The storage access layer 34 implements a higher-level disk storage protocol, such as RAID, while the storage driver layer 35 implements a lower-level storage device access protocol, such as Fibre Channel Protocol (FCP) or SCSI. To facilitate description, it is henceforth assumed herein that the storage access layer 34 implements a RAID protocol, such as RAID-4, RAID-5 or RAID-DP™, and therefore it is alternatively called the "RAID layer" 34.

Also shown in FIG. 3 is the path 37 of data flow, through the operating system 24, associated with a read or write operation. The operating system 24 also includes a user interface 38 to generate a command line interface (CLI) and/or graphical user interface (GUI), to allow administrative control and configuration of the storage system 2, from a local or remote terminal.

In certain embodiments, as illustrated in FIG. 3, the operating system 24 further includes a dynamic resizing module 36. In one embodiment, the dynamic resizing module 36 is part of the RAID layer 34. The dynamic resizing module 36 may implement the methods for resizing a RAID group or a declustered group being introduced herein, as further described below. In one embodiment, dynamic resizing module 36 is operative to communicate with file system layer 31 for retrieving a logical volume block number (VBN) from a layout data structure and passing the retrieved logical VBN to storage layer 34. Storage layer 34 maps the logical VBN to a disk block number (DBN) and sends the DBN to an appropriate driver (e.g. SCSI) of storage driver layer 35. The disk driver then accesses the DBN from the storage devices and loads the requested data block(s) in memory 224 for processing by the storage server. When a client sends a data storage request to the storage server, data may be written to the disks in accordance with a declustered layout generated by dynamic resizing module 36. In one embodiment, when the storage server receives a data storage request from the client (e.g., a request to write data to the mass storage devices), the request is held and aggregated with a number of other requests which are all written to disk at a later time, such as for example at a consistency point.

FIG. 4a is a block diagram illustrating a disk array according to an embodiment. The series of mass storage devices (e.g., disks) in the array (i.e., D0-D5) form a RAID group 400. Data blocks (or chunks) are arranged in stripes across the array of disks in RAID group 400. In one embodiment, each of the data blocks in RAID group 400 have a size of approximately 256 megabytes (MB) to 10 gigabytes (GB) of data from a single storage device. In other embodiments, the data blocks may have some other size. A larger block size reduces the size of the matrix of shared parity groups for the array, as will be described below. A parity group is formed using blocks from different storage devices. In one embodiment, the stripe width (i.e., the number of blocks in a stripe) is equal to the number of disks in the RAID group 400. Thus, each stripe includes one block on each of the disks in the array. The illustrated RAID group 400 includes six disks, although in other embodiments, the RAID group may include any number of disks greater than one.

In one embodiment, one block in each stripe is designated as the parity block (e.g., $P_1$). In the event of disk failure, a lost data block on the failed disk can be recalculated using the value of the parity block in the parity group. The value of the parity block in each stripe may be calculated by any of a number of algorithms, such as for example, the XOR of all the data blocks in the stripe. In a disk reconstruction, the value of each block in a stripe from each disk that did not fail is read and used to recalculate the data block from the failed disk using the parity algorithm. Reconstructing the failed disk requires a read operation on each disk in the parity group that did not fail and a write operation to the failed disk for every stripe. Since a read or write operation can only be performed on one block in a disk at a time, reconstruct times can be high.

FIG. 4b is a block diagram illustrating a declustered disk array according to an embodiment. In declustered RAID group 450, the stripe width is less than the number of disks in the array. In a declustered RAID group, the concept of a stripe may be referred to as a parity group. A parity group may include a self contained fault tolerant collection of blocks from different disks in declustered RAID group 450. The fault tolerance level determines the number of blocks which can be reconstructed in a parity group. The illustrated RAID group 450 includes six disks (D0-D5) but, in the case of parity groups 1-4, has a stripe width of five, and, in the case of parity group 5, has a stripe width of four. In other embodiments, the stripe width is the same for all parity groups in the RAID group. One block in each parity group is designated as the parity block and may be calculated as discussed above. Since the stripe width is less than the number of disks, however, each parity group will not include a data block from each disk. In the event of disk failure in a declustered RAID group, lost data from the failed disk can be reconstructed more quickly as greater parallelism in reading the disks is possible. Reconstruction times are further decreased by creating larger declustered RAID groups. As the size of the declustered group increases, reconstruction time decreases because the load is distributed across a larger number of storage devices. The parity groups in a declustered RAID group are organized in a particular manner to distribute the reconstruction load evenly across the large number of storage devices. Addition or removal of devices in this organization poses certain challenges addressed by the system and method described herein.

Figures 5A, 5B:
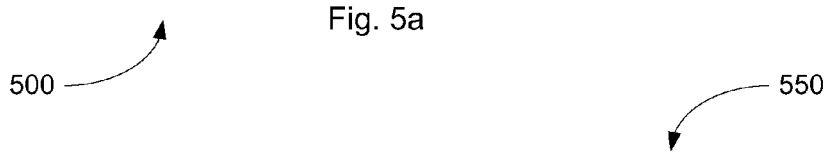
FIG. 5a is a block diagram illustrating a declustered disk array according to an embodiment.
FIG. 5b is a block diagram illustrating a matrix of shared parity groups for a declustered disk array according to an embodiment.

FIG. 5a is a block diagram illustrating a declustered disk array according to an embodiment. The mass storage devices (e.g., disks) in this declustered disk array are arranged into Declustered Group 500. In this embodiment, Declustered Group 500 includes eight disks (i.e., D0-D7) and each parity group has a stripe width of four. However, in alternative embodiments, Declustered Group 500 may include any number of disks greater than one and each parity group may have any stripe width greater than one. The parity groups in Declustered Group 500 are illustrated by number (i.e., P1-P20). In one illustrative example, parity group P13 includes blocks from D0, D3, D5 and D6. One block in each parity group may be designated as the parity block (not shown) and stores a value calculated according to the chosen parity algorithm. In an alternate embodiment, a parity group may use RAID-DP encoding, in which any two blocks in the parity group may be designated as parity blocks. In other embodiments, a parity group may implement some other fault-tolerance level and utilize any algorithm to do so.

In one embodiment, the parity groups are arranged across the disks such that any one parity group does not have more than one block on any one disk. This property maintains the fault tolerance of the parity group and allows reconstruction with only a single parity block in each parity group. The parity groups are further arranged across the disks with a balance between parity groups. When two disks in a Declustered Group each have a block in the same parity group, they are considered to share that parity group. In a perfectly balanced Declustered Group, each disk would share the same number of parity groups with every other disk. Alternatively, in an evenly balanced declustered group, the imbalance between the number of parity groups shared between a pair of disks and the number of parity groups shared between another pair of disks may be small.

FIG. 5b is a block diagram illustrating a matrix of shared parity groups for a declustered disk array according to an embodiment. In this embodiment, the matrix 550 is based on Declustered Group 500, discussed above with respect to FIG. 5a. Matrix 550 shows the number of parity groups shared between any two disks in Declustered Group 500. For example, matrix 550 shows a value of 5 at the intersection of D0 and D1, indicating that five parity groups are shared between the two disks. Disks D0 and D1 each include blocks in each of parity groups P1, P3, P7, P15 and P17. Similarly, matrix 550 shows a value of 3 at the intersection of D2 and D5 because disks D2 and D5 each include blocks in each of parity groups P8, P10 and P11. In an evenly balanced declustered group, the matrix of shared parity groups would have integral values which are either the same or very close to each other. This may be true for all elements of the matrix, except the diagonal.

As the need for storage capacity in a Declustered Group increases, it may become necessary to add an additional mass storage device to the Declustered Group. There are several considerations to take into account when adding a new disk to an existing Declustered Group. It may be desirable, for the reasons discussed above, to maintain the evenly balanced declustered organization of the Declustered Group. While maintaining the balance it may additionally be desirable to move the minimum number of data blocks from each disk previously in the Declustered Group to the new disk and to rebalance the block load evenly on each disk. The method described herein minimizes the negative effects of these considerations when adding a new disk to a Declustered Group.

Figures 6A, 6B:
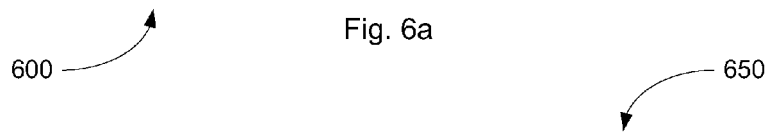
FIG. 6a is a block diagram illustrating the addition of a disk to a declustered disk array according to an embodiment.
FIG. 6b is a block diagram illustrating a matrix of shared parity groups for a declustered disk array according to an embodiment.

FIG. 6a is a block diagram illustrating the addition of a disk to a declustered disk array according to an embodiment. In one embodiment, a new disk D8 is added to Declustered Group 600. In one embodiment, the new disk D8 contains no data blocks when added to the Declustered Group. The goals of rebalancing the block load evenly while moving the minimum number of blocks can be accomplished by moving a proportion, 1/N, of the blocks from each disk previously in the Declustered Group (i.e., D0-D7) to the new disk (D8), where N is equal to the number of disks in the Declustered Group, including the newly added disk. In this embodiment, Declustered Group 600 includes nine disks, including newly added disk D8. Thus, ⅑ of the blocks from each disk (i.e., D0-D7) may be moved to the new disk D8. In this embodiment each disk has 10 blocks so ⅑ of the block is 1⅑ blocks. Since a fraction of a block cannot be moved to the new disk, the fraction may be rounded down to one block. Thus, in this embodiment, one block will be moved from each disk (i.e., D0-D7) to new disk D8.

In the example shown in FIG. 6a, one block from parity group P19 has been moved from D0 to D8 and one block from parity group P20 has been moved from D1 to D8, according to the method described herein. The description of the method will be based on the current state of Declustered Group 600, where the blocks from D0 and D1 have already been moved to D8. The matrix of shared parity groups 650, shown in FIG. 6b, is based on Declustered Group 600, shown above in FIG. 6a. It should be understood that the method described herein can be performed for each disk in the Declustered Group.

Figure 7:
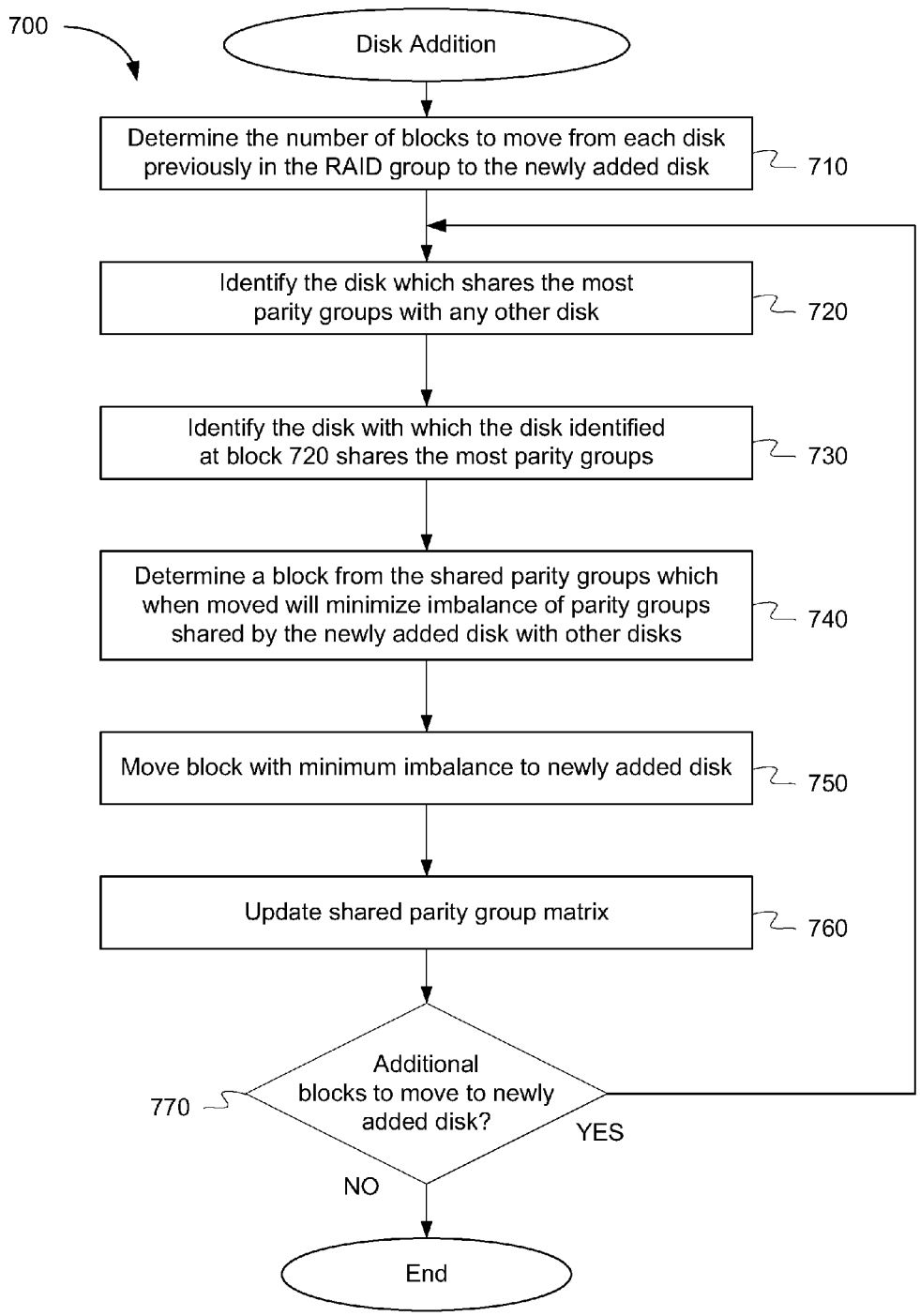
FIG. 7 is a flow chart illustrating a method for dynamically resizing a Declustered Group according to an embodiment.

FIG. 7 is a flow chart illustrating a method for dynamically resizing a Declustered Group according to an embodiment. The method 700 may be performed by processing logic that comprises hardware (e.g., circuitry, dedicated logic, programmable logic, microcode, etc.), software (e.g., instructions run on a processing device to perform hardware simulation), or a combination thereof. In one embodiment, method 700 is performed by storage system 2 of FIG. 1. In this embodiment, method 700 is a method for adding a disk to an existing Declustered Group. In one embodiment, a disk may be manually added to an existing array of disks by a storage system administrator. Adding the disk may include creating a new disk identifier in RAID layer 34 of operating system 24 illustrated in FIG. 3, as well as adding the appropriate drivers to storage driver layer 35. At block 710, method 700 determines a number of blocks to be moved from each disk already in a Declustered Group (e.g., D0-D7 of Declustered Group 600 in FIG. 6a) to a newly added disk (e.g., D8). As discussed above, a proportion, 1/N, of the blocks may be moved from each disk previously in the Declustered Group (i.e., D0-D7) to the new disk (D8), where N is equal to the number of disks in the Declustered Group, including the newly added disk. In Declustered Group 600, one block may be moved from each of the disks to new disk D8. Dynamic resizing module 36 may read information about the current disks in the Declustered Group from file system 31 to appropriately determine the number of blocks to be moved.

At block 720, method 700 identifies the disk which shares the most parity groups with any other disk. Dynamic resizing module 36 may read information on the parity shares, such as that contained in matrix of shared parity groups 650, which may be stored as a data structure in memory 224, to determine which disk has the most parity shares. As discussed above, two disks share a parity group if each disk stores a data block belonging to a same parity group. The number of shared parity groups for Declustered Group 600 is shown in matrix 650 of FIG. 6b. In this embodiment, each of disks D0-D7 have a maximum shared number of parity groups of five (i.e., each of disks D0-D7 shares five parity groups with at least one other disk). If, for example, one disk has more shared parity groups than any other disk in the Declustered Group, the disk with the most shared parity groups may be given priority. A disk with priority may have a block moved from it to the newly added disk first. Priority may be designated in a number of ways, such as for example, by promoting the disk to the top of a priority queue stored in memory 224, by activating flag associated with the disk in file system 31, etc. However, when a number of disks share the same number of parity groups, no priority is designated. In this embodiment, since no disk has priority based on the maximum number of shares, a block can be first moved from any of the disks tied for the most shares. In this case, since one block has already been moved from D0 and D1, a block may be moved from D2.

At block 730, method 700 identifies the disk with which the disk identified at block 720 shares the most parity groups. In this embodiment, D2 was identified at block 720. According to matrix 650, D2 shares five parity groups with both D3 and D6. D2 and D3 each have a block in parity groups P1, P4, P8, P15 and P18. D2 and D6 each have a block in parity groups P4, P5, P10, P18 and P19. In order to take advantage of reducing the imbalance of parity groups shared between disks D0-D7, a block may be moved from D2 that shares a parity group with either D3 or D6. Moving one such block will reduce the number of shares by 1 (between either D2 and D3 or D2 and D6), thus reducing the imbalance of shares for disks D0-D7.

At block 740, method 700 simulates moving the blocks stored on D2 in each of the shared parity groups to D8 to determine a block from one of the shared parity groups which when moved will minimize the imbalance of parity groups shared by the newly added disk with other disks, without violating the fault tolerance rule. If the block in parity group P1 on D2 in Declustered Group 600 is moved to block D8, the remaining blocks in parity group P1 will stay stored on D0, D1, and D3 and are not impacted by the move. Before moving the block on D2 in parity group P1, D8 and D0 share no parity groups, D8 and D1 share no parity groups, and D8 and D3 share one parity group (i.e., parity group P20). The sum of these shared parity groups is the resulting imbalance. Subsequent to moving the block on D2 in parity group P1, the number of parity groups shared by D8 with D0, D1 and D3 will each increase by 1, however, the number of parity groups shared by D8 with other disks doesn't change. In one embodiment, minimizing the imbalance for the parity group share load on the newly added disk is achieved by minimizing the sum of parity groups shared by D8 with other disks (i.e., D0-D7). Since, in this example (where a block on D2 in parity group P1 is simulated to be moved), only the parity groups shared by D8 with D0, D1 and D3 change, the resulting imbalance can be written as the sum of parity groups shared with D0, D1 and D3 before the move. In this embodiment the resulting imbalance is one (i.e., 0+0+1=1). A similar calculation may be done for the block on D2 in each of parity groups P4, P5, P8, P10, P15, and P18 to determine the minimum resulting imbalance. The block from parity group P19 on D2 cannot be moved to D8 because a block from parity group P19 is already stored on D8 (i.e., the block previously moved from D0). The resulting imbalance calculation for these parity groups is shown in Table 1.

TABLE 1

| Parity Group | Disks that share the parity group | Other shared parity groups | Resulting Imbalance |
| --- | --- | --- | --- |
| P1 | D0, D1, D3 | 0 + 0 + 1 | 1 |
| P4 | D3, D6, D7 | 1 + 1 + 1 | 3 |
| P5 | D0, D4, D6 | 0 + 1 + 1 | 2 |
| P8 | D3, D4, D5 | 1 + 1 + 1 | 3 |
| P10 | D1, D5, D6 | 0 + 1 + 1 | 2 |
| P15 | D0, D1, D3 | 0 + 0 + 1 | 1 |
| P18 | D3, D6, D7 | 1 + 1 + 1 | 3 |

In another embodiment, a different function may be used to compute the imbalance in parity groups shared by the newly added disk with other disks. For example, the imbalance may be computed as the variance or standard deviation of the parity groups shared by the newly added disk with other disks. In this case, minimizing the imbalance would mean minimizing the variance or standard deviation. In other embodiments, other functions can be used to compute the imbalance. In one embodiment, dynamic resizing module 36 performs the simulated block moving and the resulting imbalance calculations. The results, such as those shown in Table 1, may be stored in a data structure in memory 224.

At block 750, method 700 moves the block which results in the lowest resulting imbalance to the newly added disk. Dynamic resizing module 36 may read the data from the data structure stored in memory 224 to determine which block to move. In this embodiment, either the block on D2 from parity group P1 or parity group P15 would result in an imbalance of one. Since the resulting imbalance for both blocks is the same, either one may be moved. If, for example, one block had a lower resulting imbalance than any other block, the block with the lowest resulting imbalance may be moved to the newly added disk. In this example, the block on D2 from parity group P1 is moved to D8. FIG. 8a illustrates Declustered Group 800 which shows that the block from parity group P1 has been moved from D2 to D8.

At block 760, method 700 updates the shared parity group matrix to account for the block being moved to the newly added disk. FIG. 8b illustrates matrix 850 which is based on the current state of Declustered Group 800. Since the block from parity group P1 on D2 was moved, the number of parity groups shared by D8 with disks D0, D1 and D3 each increases by 1. This is reflected in an increase in the matrix elements. At the same time, the number of parity groups shared between disks D2 with D0, D1 and D3 each decreases by 1. The decrease is also reflected in the matrix elements.

At block 770, method 700 determines whether there are additional blocks to be moved to the newly added disk. If there are additional blocks to move, method 700 returns to block 720 and continues for the next disk. If there are no additional blocks to move, method 700 ends.

As the need for storage capacity in a Declustered Group decreases, it may be desirable to remove a mass storage device from the Declustered Group. One consideration when removing a disk from an existing Declustered Group may be to maintain the evenly balanced declustered organization of the Declustered Group. While maintaining the shared parity group balance. it may additionally be desirable to rebalance the block load evenly on each remaining disk. The method described herein minimizes the negative effects of these considerations when removing a disk from a Declustered Group.

FIG. 9a is a block diagram illustrating the removal of a disk from a declustered disk array according to an embodiment. In one embodiment, one disk D8 is removed from Declustered Group 900. In one embodiment, the disk D8 being removed contains one or more data blocks that may be redistributed among the remaining disks D0-D7.

In the example shown in FIG. 9a, D8 of Declustered Group 900 currently stores 3 data blocks. The blocks are from parity groups P2, P3 and P5, respectively. A method of redistributing those data blocks will be described based on the current state of Declustered Group 900. The matrix of shared parity groups 950, shown in FIG. 9b, is based on Declustered Group 900, shown above in FIG. 9a. It should be understood that the method described herein can be performed for each disk being removed from the Declustered Group.

Figure 10:
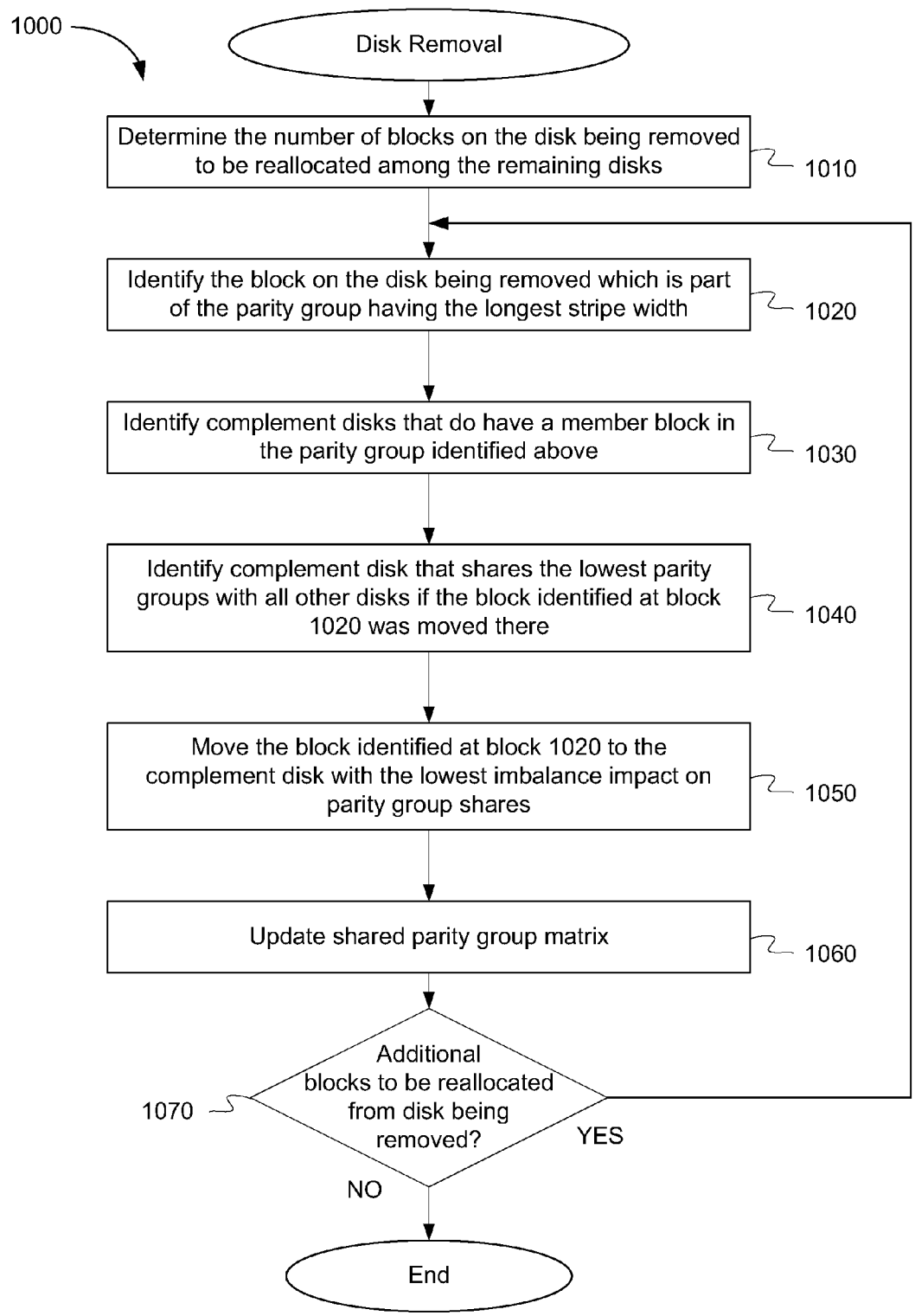
FIG. 10 is a flow chart illustrating a method for dynamically resizing a Declustered Group according to an embodiment.

FIG. 10 is a flow chart illustrating a method for dynamically resizing a Declustered Group according to an embodiment. The method 1000 may be performed by processing logic that comprises hardware (e.g., circuitry, dedicated logic, programmable logic, microcode, etc.), software (e.g., instructions run on a processing device to perform hardware simulation), or a combination thereof. In one embodiment, method 1000 is performed by storage system 2 of FIG. 1. In this embodiment, method 1000 is a method for removing a disk from an existing Declustered Group. In one embodiment, when a disk is removed from the Declustered Group, the disk identifier is removed from RAID layer 34 the associated drivers are deleted from storage driver layer 35. At block 1010, method 1000 determines the number of blocks on the disk being removed (e.g., D8) to be reallocated among the remaining disks (e.g., D0-D7 of Declustered Group 900 in FIG. 9a). All blocks on D8 may be reallocated evenly among the remaining disks. In one embodiment, they may be allocated in a manner which ensures that the block layout is evenly declustered (i.e., the number of parity groups shared between the two disks is the same or almost the same). In this example, there are eight remaining disks and D8 has three blocks, so three of the eight remaining disks will be allocated one block and five will be allocated no blocks. Dynamic resizing module 36 may read information about the current disks in the Declustered Group from file system 31 to appropriately determine the number of blocks to reallocate to each remaining disk.

At block 1020, method 1000 identifies the block on the disk being removed D8 which is part of a parity group having the longest stripe width. If, for example, one block was part of parity group with a long stripe width than any other block on the disk being removed, the block with the longest parity group stripe width may be given priority. This is because the block can only be moved to a disk which doesn't have any other block from the same parity group. Hence, a parity group with the higher stripe-width will have fewer possible candidate disks for where the block from the disk being removed can be moved to. Giving priority to such a parity group will reduce the probability of the move failing, which may occur if none of the candidate (i.e. complement) disks has a free block. A block with priority may be reallocated to a remaining disk first. However, when a number of blocks have the same parity group stripe width, no priority is designated. In this example, each of parity groups P2, P3 and P5 have a stripe width of five. Since no block has priority, any of the blocks with the longest parity group stripe width may be chosen (e.g., the block from parity group P2). The remaining portion of the method will be described with respect to the block on D8 from parity group P2.

At block 1030, method 1000 identifies the complement disks for the block identified at block 1020. Complement disks for the block identified at 1020 are those disks which do not have a member block from parity group corresponding the block identified at 1020. In this case, the complement disks for the block on D8 from parity group P2 are D0-D3. Disks D4-D7 already have a block from parity group P2 stored thereon and, thus, are not complement disks. Dynamic resizing module 36 may read information on stripe width and complement disks, such as that contained in a data structure representing Declustered Group 900, which may be stored in memory 224.

At block 1040, method 100 identifies the complement disk with the lowest imbalance impact on parity group shares for the whole declustered group if the block identified at block 1020 was moved there. In one embodiment, the imbalance impact on parity group shares is the sum of shares between a complement disk and all the other disks that already have a block from the parity group corresponding to the block being moved (i.e., the non-complement disks). By attempting to pick a disk which has the minimum sum of parity group shares with the non-complement disks, the total sum of shares for the whole declustered group will also be minimized. In this example, the imbalance impact on parity group shares for D0, as a result of moving a block from parity group P2 on disk D8, can be calculated as the sum of the shares between D0 and D4, D5, D6 and D7. The number of shared parity groups can be determined from matrix 950 in FIG. 9b. D0 and D4 currently share 5 parity groups, D0 and D5 currently share 4 parity groups, D0 and D6 currently share 4 parity groups and D0 and D7 currently share 3 parity groups. Thus, the total imbalance impact on parity group shares for D0 would be 5+4+4+3=16. The total shares for each of the complement disks may be similarly calculated as shown in Table 2.

TABLE 2

| Complement disk | Shares with non-complement disks D4, D5, D6, D7 | Total imbalance impact on parity group shares |
| --- | --- | --- |
| D0 | 5 + 4 + 4 + 3 | 16 |
| D1 | 4 + 5 + 3 + 4 | 16 |
| D2 | 4 + 3 + 5 + 3 | 15 |
| D3 | 3 + 4 + 4 + 5 | 16 |

In one embodiment, dynamic resizing module 36 performs the simulated block moving and the resulting imbalance calculations. The results, such as those shown in Table 2, may be stored in a data structure in memory 224.

At block 1050, method 1000 moves the block identified at block 1020 to the complement disk with the lowest imbalance impact on parity group shares. Dynamic resizing module 36 may read the data from the data structure stored in memory 224 to determine which block to move. In this embodiment, moving the block in parity group P2 from D8 to D2 would result in an imbalance impact on parity group shares of 15. If, for example, moving the block to any of two or more complement disks would result in the same minimum imbalance impact on parity group shares, the block may be moved to the complement disk with the least number of total blocks. In this example, the block on D8 from parity group P2 is moved to D2. FIG. 11a illustrates Declustered Group 1100 which shows that the block from parity group P2 has been moved from D8 to D2. In another embodiment, the imbalance impact on parity group shares can be calculated by a different function. For example, the imbalance impact on parity group shares can be computed as the new variance or standard deviation of the set of parity group shares of a candidate disk with the non-complement disks. In other embodiments, other functions can also be used for computing the Imbalance impact on parity group shares.

At block 1060, method 1000 updates the shared parity group matrix to account for the block being reallocated to a remaining disk. FIG. 11b illustrates matrix 1150 which is based on the current state of Declustered Group 1100. Since the block from parity group P2 on D8 was moved, the number of parity groups shared by D2 with disks D4-D7 each increases by 1. This is reflected in an increase in the matrix elements. At the same time, the number of parity groups shared between disks D8 with D4-D7 each decreases by 1. The decrease is also reflected in the matrix elements.

At block 1070, method 1000 determines whether there are additional blocks to be reallocated from the disk being removed. If there are additional blocks to be reallocated, method 1000 returns to block 1020. If there are no additional blocks to move, method 1000 ends.

The above description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Embodiments of the present invention include various operations, which are described above. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

The digital processing devices described herein may include one or more general-purpose processing devices such as a microprocessor or central processing unit, a controller, or the like. Alternatively, the digital processing device may include one or more special-purpose processing devices such as a digital signal processor (DSP), an application specific integrated circuit (ASIC), a field programmable gate array (FPGA), or the like. In an alternative embodiment, for example, the digital processing device may be a network processor having multiple processors including a core unit and multiple microengines. Additionally, the digital processing device may include any combination of general-purpose processing devices and special-purpose processing device(s).

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader scope of the invention as set forth in the appended claims. The specification and drawings are, accordingly, to be regarded in an illustrative sense rather than a restrictive sense.

What is claimed is:

1. A method, comprising:
upon receiving a request to resize an original array of mass storage devices, generating a declustered organization layout for data blocks in the resized array of mass storage devices by determining a data block from a first mass storage device in the original array to move, wherein the request to resize the array comprises a request to add a new mass storage device to the array;
storing the declustered organization layout as a data structure in memory of a storage server; and
configuring, by the storage server, the resized array of mass storage devices according to the declustered organization layout by moving the determined data block from the first mass storage device to a second mass storage device in the resized array, and wherein configuring the resized array further comprises:
moving data blocks from the mass storage devices previously in array to the new mass storage device, wherein during said moving, a reconstruction load is evenly balanced across the array of mass storage devices, and wherein no two blocks in a same parity group are on a same mass storage device in the array, and a total number of blocks moved from the mass storage devices previously in the array to the new mass storage device is minimized.

2. A method, comprising:
upon receiving a request to resize an original array of mass storage devices, generating a declustered organization layout for data blocks in the resized array of mass storage devices by determining a data block from a first mass storage device in the original array to move;
storing the declustered organization layout as a data structure in memory of a storage server; and
configuring, by the storage server, the resized array of mass storage devices according to the declustered organization layout by moving the determined data block from the first mass storage device to a second mass storage device in the resized array, wherein configuring the resized array further comprises:
identifying the first mass storage device previously in the array, wherein the first mass storage device shares a highest number of parity groups with any other mass storage device previously in the array;
identifying a second mass storage device previously in the array with which the first mass storage device shares the highest number of parity groups;
identifying the data block from the first mass storage device, wherein the data block is in a shared parity group and will minimize an imbalance of parity groups if moved to the new mass storage device; and
moving a data block from a first mass storage device previously in the array to the new mass storage device to minimize the imbalance of parity groups shared by the new mass storage device and the array of mass storage devices.

3. The method of claim 2, further comprising:
updating a shared parity group matrix for the array of mass storage devices.

4. A method, comprising:
upon receiving a request to resize an original array of mass storage devices, generating a declustered organization layout for data blocks in the resized array of mass storage devices by determining a data block from a first mass storage device in the original array to move, wherein the request to resize the array comprises a request to remove a first mass storage device from the array;
storing the declustered organization layout as a data structure in memory of a storage server; and
configuring, by the storage server, the resized array of mass storage devices according to the declustered organization layout by moving the determined data block from the first mass storage device to a second mass storage device in the resized array, wherein configuring the resized array further comprises:
moving data blocks from the first mass storage device in the array to the remaining mass storage devices, wherein during said moving, a reconstruction load is evenly balanced across the array of mass storage devices, and wherein no two blocks in a same parity group are on a same mass storage device in the array, and a total number of blocks moved from the first mass storage device to the remaining mass storage devices is minimized.

5. A method, comprising:
upon receiving a request to resize an original array of mass storage devices, generating a declustered organization layout for data blocks in the resized array of mass storage devices by determining a data block from a first mass storage device in the original array to move;

storing the declustered organization layout as a data structure in memory of a storage server; and configuring, by the storage server, the resized array of mass storage devices according to the declustered organization layout by moving the determined data block from the first mass storage device to a second mass storage device in the resized array, wherein configuring the resized array further comprises:

identifying the data block on the first mass storage device, wherein the data block is part of parity group having a longest stripe width; and identifying a complement mass storage device in the array, wherein the complement mass storage device does not share the parity group having the longest stripe width with the first mass storage device, and wherein moving the data block to the complement mass storage device will minimize an imbalance impact on parity group shares between the complement disk and other disks in the array; and moving a data block from the first mass storage device in the array to a mass storage device remaining in the array to minimize the imbalance of parity groups shared by the remaining mass storage devices.

6. The method of claim 5, further comprising:
updating a shared parity group matrix for the array of mass storage devices.

7. A system comprising:
an array of mass storage devices; and
a storage server coupled to the array of mass storage devices, the storage server configured to:
    upon receiving a request to resize the array of mass storage devices, generate a declustered organization layout for data blocks in the array of mass storage devices, wherein the request to resize the array comprises a request to add a new mass storage device to the array;
    store the declustered organization layout as a data structure in memory of the storage server; and
    configure the resized array of mass storage devices according to the declustered organization layout, wherein configuring the resized array further comprises the storage server configured to:
        identify the first mass storage device previously in the array, wherein the first mass storage device shares a highest number of parity groups with any other mass storage device previously in the array;
        identify a second mass storage device previously in the array with which the first mass storage device shares the highest number of parity groups; and
        identify the data block from the first mass storage device, wherein the data block is in a shared parity group and will minimize an imbalance of parity groups if moved to the new mass storage device;
        move a data block from a first mass storage device previously in the array to the new mass storage device to minimize the imbalance of parity groups shared by the new mass storage device and the array of mass storage devices.

8. The system of claim 7, wherein when the storage server adds a new mass storage device, the storage server is further configured to:
update a shared parity group matrix for the array of mass storage devices.

9. A system comprising:
an array of mass storage devices; and
a storage server coupled to the array of mass storage devices, the storage server configured to:
    upon receiving a request to resize the array of mass storage devices, generate a declustered organization layout for data blocks in the array of mass storage devices and remove a first mass storage device from the array;
    store the declustered organization layout as a data structure in memory of the storage server; and
    configure the resized array of mass storage devices according to the declustered organization layout, wherein when the storage server configures the resized array, the storage server is further configured to:
        identify the data block on the first mass storage device, wherein the data block is part of parity group having a longest stripe width;
        identify a complement disk in the array, wherein the complement disk does not share the parity group having the longest stripe width with the first mass storage device, and wherein moving the data block to the complement disk will minimize an imbalance impact on parity group shares between the complement disk and other disks in the array; and
        move a data block from the first mass storage device in the array to a mass storage device remaining in the array to minimize the imbalance of parity groups shared by the remaining mass storage devices.

10. The system of claim 9, wherein when the storage server removes a mass storage device, the storage server is further configured to:
update a shared parity group matrix for the array of mass storage devices.

11. A storage server comprising:
a processor unit; and
a memory, coupled to the processor unit, storing instructions which, when executed by the processor unit, cause the storage server to:
    upon receiving a request to resize an array of mass storage devices, generate a declustered organization layout for data blocks in the array of mass storage devices, and wherein the request to resize the array comprises a request to add a new mass storage device to the array;
    store the declustered organization layout as a data structure in memory of the storage server; and
    configure the resized array of mass storage devices according to the declustered organization layout, wherein the instructions to configure the resized array further comprises instructions to:
        identify the first mass storage device previously in the array, wherein the first mass storage device shares a highest number of parity groups with any other mass storage device previously in the array;
        identify a second mass storage device previously in the array with which the first mass storage device shares the highest number of parity groups;
        identify the data block from the first mass storage device, wherein the data block is in a shared parity and will minimize an imbalance of parity groups if moved to the new mass storage device; and
        move a data block from a first mass storage device previously the array to the new mass storage device to minimize the imbalance of parity groups shared by the new mass storage device and the array of mass storage devices.

12. The storage server of claim 11, wherein when the storage server adds a new mass storage device, the instructions further cause the storage server to:
update a shared parity group matrix for the array of mass storage devices.

13. A storage server comprising:
a processor unit; and
a memory, coupled to the processor unit, storing instructions which, when executed by the processor unit, cause the storage server to:
upon receiving a request to resize an array of mass storage devices, generate a declustered organization layout for data blocks in the array of mass storage devices, and wherein the request to resize the array comprises a request to remove a first mass storage device from the array;
store the declustered organization layout as a data structure in memory of the storage server; and
configure the resized array of mass storage devices according to the declustered organization layout, wherein the instructions to configure the resized array further comprises instructions to:
identify the data block on the first mass storage device, wherein the data block is part of parity group having a longest stripe width;
identify a complement disk in the array, wherein the complement disk does not share the parity group having the longest stripe width with the first mass storage device, and wherein moving the data block to the complement disk will minimize an imbalance impact on parity group shares between the complement disk and other disks in the array; and
move a data block from the first mass storage device in the array to a mass storage device remaining in the array to minimize the imbalance of parity groups shared by the remaining mass storage devices.

14. The storage server of claim 13, wherein when the storage server removes a mass storage device, the instructions further cause the storage server to:
update a shared parity group matrix for the array of mass storage devices.

* * * * *